United States Patent
Shibata et al.

(10) Patent No.: US 6,703,255 B2
(45) Date of Patent: Mar. 9, 2004

(54) METHOD FOR FABRICATING A III NITRIDE FILM

(75) Inventors: Tomohiko Shibata, Nagoya (JP); Shigeaki Sumiya, Nagoya (JP); Keiichiro Asai, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/102,545

(22) Filed: Mar. 20, 2002

(65) Prior Publication Data

US 2002/0155682 A1 Oct. 24, 2002

Related U.S. Application Data

(60) Provisional application No. 60/303,127, filed on Jul. 5, 2001.

(30) Foreign Application Priority Data

Mar. 28, 2001 (JP) .......................................... 2001-091837
Nov. 19, 2001 (JP) .......................................... 2001-353212

(51) Int. Cl.$^7$ .............................................. H01L 21/00
(52) U.S. Cl. ........................................ 438/46; 438/503
(58) Field of Search .................................. 257/76, 77, 97, 257/103, 183, 190, 200; 438/46–48, 503, 507, 967

(56) References Cited

U.S. PATENT DOCUMENTS

| | | | |
|---|---|---|---|
| 6,462,357 B1 * | 10/2002 | Tsai et al. | 257/97 |
| 6,504,183 B1 * | 1/2003 | Chang et al. | 257/103 |
| 6,534,332 B2 * | 3/2003 | Bourret-Courchesne | 438/47 |
| 6,534,795 B2 * | 3/2003 | Hori et al. | 257/79 |
| 2002/0020850 A1 | 2/2002 | Shibata et al. | |

OTHER PUBLICATIONS

U.S. patent application Ser. No. 09/981,295, Docket No. 782 190, Shibata et al. filed date Oct. 16, 2001.

U.S. patent application Ser. No. 10/163,256, Docket No. 800 087, Shibata et al. filed date Jun. 5, 2002.

U. S. patent application Ser. No. 10/074,589, Docket No. 782 172 NP, Shibata et al. filed date Feb. 13, 2002.

* cited by examiner

*Primary Examiner*—Kamand Cuneo
*Assistant Examiner*—Asok Kumar Sarkar
(74) *Attorney, Agent, or Firm*—Burr & Brown

(57) ABSTRACT

Plural island-shaped crystal portions are formed on a first Al-including nitride base. The island-shaped crystal portions are made of a second nitride, and have a nitride film including a third nitride epitaxially grown thereon. The island-shaped crystal portions function as nuclei during the growth of the third nitride-including film.

17 Claims, 2 Drawing Sheets

METHOD FOR FABRICATING A III NITRIDE FILM

BACKGROUND OF THE INVENTION (1) Field of the invention

This invention relates to a method for fabricating a III nitride film, particularly usable as an underfilm for a semiconductor element such as a light-emitting diode or a high velocity IC chip.

(2) Related Art Statement

III nitride films are employed as semiconductor films constituting a light-emitting diode, and recently, win a lot of attention as semiconductor films constituting high velocity IC chips to be used in cellular phone systems.

Such III nitride films are usually fabricated by MOCVD methods. Concretely, a substrate on which III nitride films are formed is set onto a susceptor installed in a given reactor, and then, heated to 1000° C. or over with a heater provided in or out of the susceptor. Thereafter, raw material gases are introduced with a carrier gas into the reactor and supplied onto the substrate.

On the substrate, the raw material gases are dissolved through thermochemical reaction into constituent elements, which are reacted to deposit and fabricate a desired III nitride film on the substrate.

As the composition of a III nitride film is changed, the lattice constant of the film is changed on a larger scale. In this case, the difference in lattice constant between the III nitride film and the substrate is enlarged, and thus, more misfit dislocations may be created at the boundary between the III nitride film and the substrate.

Under the condition, if the III nitride film is epitaxially grown, many dislocations of the order of about $1010/cm^2$ may be created due to the propagation of the misfit dislocations. As a result, the crystal quality may be deteriorated, and thus, the electrical and optical properties of the III nitride film may be deteriorated.

In order to eliminate the above problem, such an attention is made as making a mask of $SiO_2$, etc., on a substrate, and epitaxially growing a III nitride film laterally on the mask. According to the epitaxially growing method, misfit dislocations, which are created at the boundary between the substrate and the III nitride film to be fabricated, are propagated only in the direction parallel to the top surface of the mask, not in the thickness direction of the III nitride film. Therefore, the dislocation density of the III nitride film can be reduced in between the pattern rods of the mask.

In the above fabricating method, however, a lithographing process including a given etching process is required so as to fabricate the $SiO_2$ mask, and thus, the number of steps for fabricating the III nitride film is increased, causing the total fabricating process for the III nitride film to be complicated.

SUMMARY OF THE INVENTION

It is an object of the present invention to provide a method capable of easily fabricating a III nitride film of lower dislocation density, and in addition, a substrate for epitaxial growth.

In order to achieve the above object, this invention provides a method for fabricating a III nitride film, including the steps of:

preparing a given base made of a first Al-including nitride, forming plural island-shaped crystal portions made of a second nitride which are isolated from one another, and epitatially growing a nitride film made a third nitride from the island-shaped crystal portions functioning as nuclei.

In this invention, the term "base" means a given substrate and a given underfilm which are made of the first Al-including nitride.

The inventors had intensely studied to obtain a III nitride film with lower dislocation density through an easy fabricating process without the need to use, for example, a patterned mask made of $SiO_2$.

FIGS. 1–3 are conceptual views for the fabricating method of the present invention.

First of all, on a base 1 made the first Al-including nitride are island-shaped crystal portions 2-1 through 2-4 made of the second nitride, as shown in FIG. 1. The island-shaped crystal portions 2-1 through 2-4 are employed as nuclei for epitaxially growth. Then, a III nitride film 3A is epitaxially grown from the island-shaped crystal portions 2-1 through 2-4, as shown in FIG. 2, and thus, a III nitride film 3 as desired is fabricated, as shown in FIG. 3.

That is, since the sizes of the island-shaped crystal portions 2-1 through 2-4 are reduced remarkably, the III nitride film 3A is grown three-dimensionally from the island-shaped crystal portions functioning as nuclei in an early growth step. Therefore, dislocations penetrated from the base 1 are curved and propagated laterally. As a result, even though there are many dislocations in the base 1, almost all of the dislocations are not propagated in the direction perpendicular to the surface of the base 1, that is, in the thickness direction of the III nitride film 3.

Accordingly, if the island-shaped crystal portions 2-1 through 2-4 are employed as nuclei for epitaxial growth and then, a III nitride film as desired is epitaxially grown from the crystal portions, the dislocation density of the III nitride film can be reduced. Also, since the dislocation density of the island-shaped crystal portions is very low, the dislocation density of the III nitride film can be greatly reduced.

In the present invention, as mentioned above, since the lateral epitaxial growth is enhanced, the low dislocation density of the III nitride film can be realized through the total growth process beginning with the early growth step.

The above-mentioned tendency becomes conspicuous, on the condition that the full width of half maximum (FWHM) of an X-ray rocking curve at (002) reflection of the base 1, or an underfilm instead of the base 1, is set to 90 seconds or below.

The island-shaped crystal portions can be made by controlling MOCVD conditions appropriately. Three kinds of principles (discussed in the following) are considered as the reasons of such a growth mode.

The first principle relates to the difference in lattice constants between the first Al-including nitride to form the base and the second nitride to form the island-shaped crystal portions. That is, if the lattice constant of the second nitride is larger than that of the first nitride, a given film made of the second nitride is grown on SK mode. Therefore, the film is not formed uniformly, but grown from given nuclei to have an island-like shape. As a result, the above-mentioned island-shaped crystal portions are made.

The second principle relates to the oxidation of the main surface of the base which is made of the first Al-including nitride. That is, if a given oxidized film is formed on the base through the oxidation of the main surface of the base, the second nitride is selectively deposited and agglomerated on exposed areas without the oxidized film of the main surface of the base. As a result, a uniform film is not formed as the second nitride, and is grown three-dimensionally from the exposed areas, which is made of nitride, as nuclei. In this way, the above-mentioned island-shaped crystal portions are made.

The third principle relates to the agglomeration due to composition fluctuation. That is, the constituents of the base is dispersed ununiformly to some degree therein, not uniformly. In this case, the second nitride is selectively deposited and agglomerated, correspondent with the composition distribution in the base. As a result, a uniform film is not formed as the second nitride, and is grown three-dimensionally from the agglomerated portions. In this way, the above-mentioned island-shaped crystal portions are made.

As mentioned above, although the nitride film made of the third nitride is epitaxially grown from the island-shaped crystal portions functioning as nuclei, the nitride film is also epitaxially grown directly on the base to some degree, as shown in FIG. 2.

In the present invention, the term "the nitride film made of the third nitride" means a single nitride layer and a multilayered structure made of plural nitride films such as a distorted superlattice structure. Also, the term means a film of which the composition is continuously or stepwisely inclined in the thickness direction.

This invention relates to a substrate for epitaxial growth, including;

a base made of a first Al-including nitride, and plural island-shaped crystal portions made of a second nitride which are formed on the base and isolated from one another.

In this invention, the term "base" also means a given substrate and a given underfilm which are made of the first Al-including nitride.

The substrate for epitaxial growth includes the plural island-shaped crystal portions, which are made of the second nitride on the base, which is made of the first nitride. Therefore, if the substrate of the present invention is employed, a III nitride film of low dislocation density can be obtained.

The resulting III nitride film made of the third nitride may be employed as a semiconductor film to construct a semiconductor element, particularly such as a high velocity IC chip and a semiconductor light emitting element such as light-emitting diode. Also, the substrate for epitaxial growth may be employed for such a semiconductor element or a semiconductor light-emitting element. As a result, the luminance efficiency of the semiconductor light-emitting element and the high velocity response of the semiconductor element can be improved.

BRIEF DESCRIPTION OF THE DRAWINGS

For better understanding of the present invention, reference is made to the attached drawings, wherein.

DETAILED DESCRIPTION OF THE INVENTION

Figure 1:
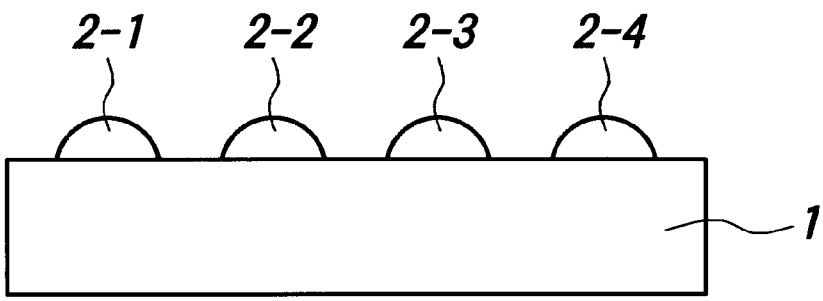
FIG. 1 is a conceptual views for the fabricating method of the present invention.
Figure 2:
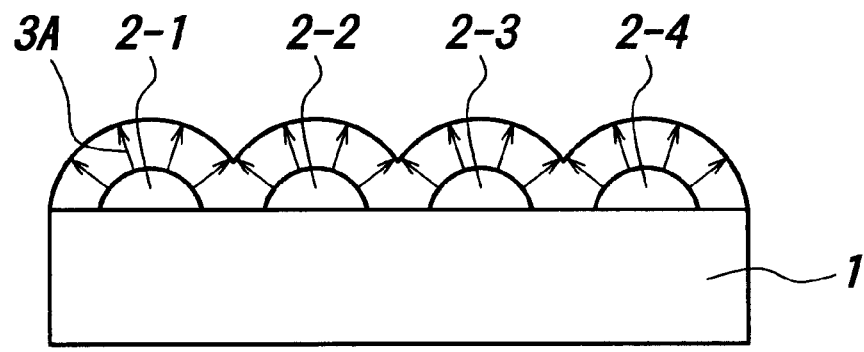
FIG. 2 is a conceptual views for the fabricating method of the present invention.
Figure 3:
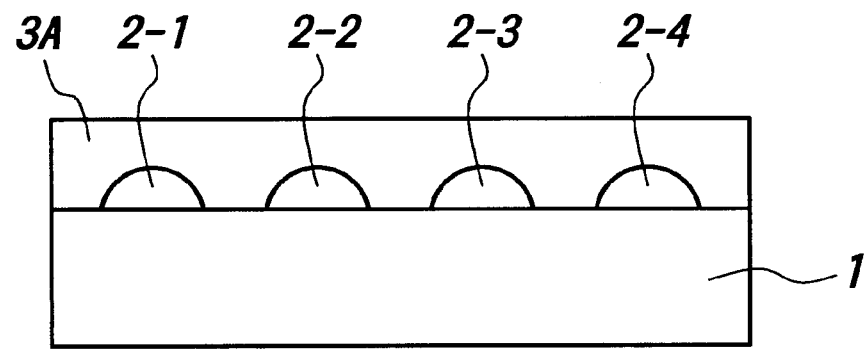
FIG. 3 is a conceptual views for the fabricating method of the present invention.

This invention will be described in detail, hereinafter.

In the present invention, it is required that plural isolated island-shaped crystal portions, which are made of a second nitride, are formed on a base made of a first Al-including nitride. The sizes of the island-shaped crystal portions are not limited only if a nitride film made of a third nitride is epitaxially grown from the crystal portions functioning as nuclei.

However, it is more preferable as the average area of the top surface of each island-shape crystal portion is increased. Concretely, it is desired that the average area of the top surface is set to about 100 $\mu m^2$. Moreover, it is desired that the lower limited value of the average area of the top surface is set to 0.0001 $\mu m^2$, particularly 1 $\mu m^2$. In this case, the desired nitride film with lower dislocation density, which is made of the third nitride, can be efficiently fabricated in a shorter period of time.

The epitaxial growth condition of the nitride film is appropriately set, dependent on the sort of the first Al-including nitride to form the base, the sort of the second nitride to form the island-shaped crystal portions, the sort of the third nitride to form the nitride film as desired and the sizes of the island-shaped crystal portions.

The first through the third nitride may be different from one another in material and composition, and two or all thereof may be equal.

It is also desired that the Al content of the second nitride is set larger than the Al content of the first nitride. In this case, if a given thinner film made of he second nitride is formed on the base made of the first nitride by a film growth method, such as CVD, MBE and so on, it may be affected by the compression tress from the base. Therefore, the film is grown on SK mode, and divided into plural isolated island-shaped portions.

As a result, by adjusting the compositions of the first nitride and the second nitride appropriately, the island-shaped crystal portions are easily made by a normal CVD method.

Concretely, on the condition that the composition of the second nitride is set to $Al_{x1}Ga_{x2}In_{x3}N$ (x1+x2+x3=1, x1, x2, x3≧0) and the composition of the first nitride is set to $Al_{y1}Ga_{y2}In_{y3}N$ (y1+y2+y3=1, y1>0, y2, y3≧0), the relation of x1≦y1−0.1 is preferably satisfied for the Al content x1 of the second nitride and the Al content y1 of the first nitride. Thereby, the dislocation density of the nitride film as desired can be easily reduced up to $10^{10}/cm^2$ or below.

Moreover, if the relation of x1<y1−0.5 is satisfied, the dislocation density can be reduced up to $10^9/cm^2$ or below, particularly $10^8/cm^2$ or below.

Herein, the above-mentioned composition relation is defined on the average compositions of the second nitride and the first nitride. Therefore, only if the composition relation is satisfied as mentioned above, particularly, the composition of the first nitride may be continuously or stepwisely inclined in the base. Moreover, the base is constructed of a distorted superlattice structure made of plural nitride films stacked periodically having their respective compositions.

The first through the third nitrides may include an additive element such as Ge, Si, Mg, Zn, Be, P or B as occasion demands. Moreover, the first through the third nitrides may include a minute impurity contained in the raw material gases and the reactor or contained dependent on the forming condition.

Moreover, it is desired that the FWHM of an X-ray rocking curve at (002) reflection of the first nitride to form the base is set to 90 seconds or below, particularly 50 seconds. In this case, the dislocation density of the desired nitride film made of the third nitride can be greatly reduced. Similarly, the surface roughness Ra of the nitride film is preferably set to 2 Å or below.

The base may be made of an oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as $ZrB_2$.

Moreover, the base may be composed of an under base made of a single crystal as mentioned above and an epitaxial growth film made of oxide single crystal such as ZnO single crystal or MgO single crystal, IV single crystal or IV—IV single crystal such as Si single crystal or SiC single crystal, III–V single crystal such as GaAs single crystal or InP single crystal and a mixed crystal thereof.

Particularly, in the case that the sapphire single crystal is employed, that is, the base is made of the sapphire single crystal or the under base is made of the sapphire single crystal and then, the epitaxial growth film is formed on the under base, it is desired that the main surface of the base or the under base is nitrided.

The nitriding process is carried out as follows. The sapphire single crystal substrate is set in a nitrogen-including atmosphere such as an ammonia atmosphere, and then, heated for a given period. The thickness of the resulting surface nitride layer can be adjusted by controlling the nitrogen concentration, the nitriding temperature and the nitriding period appropriately.

As mentioned above, since the nitride film made of the third nitride is partially formed directly on the base, the crystal quality of the nitride film can be much enhanced if the nitride film is formed on the nitride layer of the base. However, without the nitriding process, the object of the present invention can be sufficiently realized.

Figure 4:
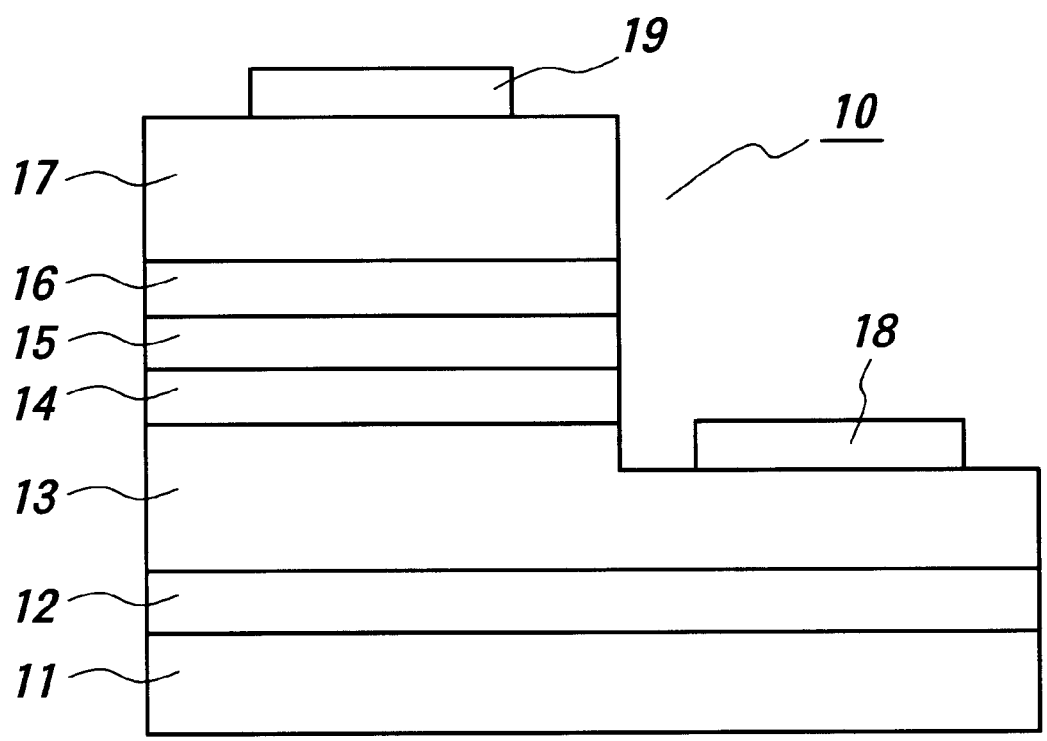
FIG. 4 is a structural view showing a semiconductor light-emitting element including a III nitride film fabricated according to the present invention.

FIG. 4 is a structural view showing a semiconductor light-emitting element including a III nitride film fabricated according to the present invention.

A semiconductor light-emitting element 10 shown in FIG. 4 includes a substrate 11, an underlayer 12 made of, for example, AlN, a first conductive layer 13 made of, for example, n-AlGaN. Then, the element 10 includes a first cladding layer 14 made of, for example, n-AlGaN which is formed on the first conductive layer 13, a light-emitting layer 15 made of, for example, i-AlGaN which is formed on the first cladding layer 14, a second cladding layer 16 made of, for example, p-AlGaN which is formed on the light-emitting layer 15, and a second conductive layer 17 made of, for example, p-AlGaN which is formed on the second cladding layer 16.

The first conductive layer 13 is partially removed and exposed, and an n-type electrode 18 of Al/Pt is provided on the exposed surface of the first conductive layer 13. Then, a p-type electrode 19 of Au/Ni is provided on the second conductive layer 17.

In this case, the substrate 11 is defined as the base of the present invention. Therefore, if island-shaped crystal portions are formed on the substrate 11, and then, the underlayer 12 is epitaxially grown from the island-shaped crystal portions as nuclei, the dislocation density and thus, the crystal quality of the underlayer 12 can be remarkably improved. Therefore, the crystal qualities of the first conductive layer 13 through the second conductive layer 17 can be also improved, and thus, the luminance efficiency of the semiconductor light-emitting element 10 can be enhanced.

In this case, the substrate for epitaxial growth is composed of the substrate 11 and the island-shaped crystal portions.

Moreover, the underlayer 12 may be defined as the base of the present invention. Therefore, if island-shaped crystal portions are formed on the underlayer 12, and then, the first conductive layer 13 is epitaxially grown from the island-shaped crystal portions functioning as nuclei, the dislocation density and thus, the crystal quality of the first conductive layer 13 can be remarkably improved. Therefore, the crystal qualities of the first cladding layer 14 through the second conductive layer 17 can be also improved, and thus, the luminance efficiency of the semiconductor light-emitting element 10 can be enhanced.

Herein, the underlayer 12 through the second conductive layer 17 may be made by conventional MOCVD methods. In the case of epitaxially growing the underlayer 12 or the first conductive layer 13 from the island-shaped crystal portions, the MOCVD condition for the layer 12 or 13 is determined on the sizes of the island-shaped crystal portions or the like.

EXAMPLES

This invention will be concretely described hereinafter, with reference to Examples.

Example 1

An under base was made of C-faced sapphire single crystal and then, set and attracted on a susceptor installed in a quartz reactor of a MOCVD apparatus, and heated to 1200° C. with a heater built in or out of the susceptor. Then, an ammonia gas ($NH_3$) was flown into the reactor, and the under base was held at 1200° C. under the $NH_3$ atmosphere for pretreatment.

Then, a trimethyaluminum (TMA) and an $NH_3$ gas were employed as an Al raw material gas and a nitrogen raw material gas, respectively, and were introduced with a $H_2$ carrier gas into the reactor at a flow ratio of TMA/$NH_3$=0.5 sccm/350 sccm and supplied onto the substrate, to form an AlN film in a thickness of 1 μm through epitaxial growth for 60 minutes. In this way, a given base, which is composed of the under base made of sapphire single crystal and the AlN film, was fabricated. The crystallinity of the AlN film was examined by X-ray analysis, and as a result, it turned out to be 50 seconds in the FWHM.

Then, the base temperature is lowered up to 1070° C., a trimethylgallium (TMG) was additionally employed as a Ga raw material gas. Then, the TMA, the TMG and the $NH_3$ gas were supplied onto the AlN film at a flow ratio of TMA/TMG/$NH_3$=0.1 sccm/0.9 sccm/3000 sccm, to form island-shaped crystal portions made of $Al_{0.1}Ga_{0.9}N$. Herein, the average area of the top surface of each island-shaped crystal portions was almost 1 μm$^2$.

Then, the base temperature was increased up to 1200° C., and the raw material gases were supplied onto the base at a flow ratio of TMA/TMG/$NH_3$=0.95 sccm/0.05 sccm/350 sccm, to epitaxially grow an $Al_{0.95}Ga_{0.05}N$ film in a thickness of 1 μm from the island-shaped crystal portions as nuclei. The dislocation density of the $Al_{0.95}Ga_{0.05}N$ film was turned out to be 1×10$^9$/cm$^2$ by TEM observation.

Example 2

An under base was made of C-faced sapphire single crystal, pretreated and the AlN film was formed in a thickness of 1 μm, in the same manner as in Example 1. Then, the thus obtained base was heated up to 1080° C., and the TMG and the NH$_3$ gas were supplied onto the base at a flow rate of TMG/NH$_3$=1 sccm/3000 sccm, to form island-shaped crystal portions on the AlN film of the base. In this case, the average area top surface of each of the island-shaped crystal portions was 1 μm$^2$.

Then, the base was held at the same temperature, and then, the TMG and the NH$_3$ gas were supplied onto the AlN film and the island-shaped crystal portions, to epitaxially grow a GaN film in a thickness of 3 μm. The dislocation density off the GaN film was turned out to be 5×10$^7$/cm$^2$ by TEM observation.

Example 3

Except that an AlN film was epitaxially grown on the under base heated at 900° C., island-shaped crystal portions and an Al$_{0.95}$Ga$_{0.05}$N film were made in the same manner as in Example 1. When the crystallinity of the Al$_{0.95}$Ga$_{0.05}$N film was examined by X-ray analysis, the FWHM in X-ray rocking curve at (002) reflection was about 300 seconds. Also, the dislocation density of the Al$_{0.95}$Ga$_{0.05}$N film was turned out to be 8×10$^9$/cm$^2$ by TEM observation.

Comparative Example

Except that the island-shaped crystal portions were not made, an Al$_{0.95}$Ga$_{0.05}$N film was made in the same manner an in Example 1. The dislocation density of the Al$_{0.95}$Ga$_{0.05}$N film was turned out to be 5×10$^{10}$/cm$^2$.

As is apparent from Examples and Comparative Example, it is turned out that the dislocation density of the Al$_{0.95}$Ga$_{0.05}$N film as a nitride film fabricated according to the present invention was reduced up to 10$^{10}$cm$^2$ or below, and thus, the crystal quality of the Al$_{0.95}$Ga$_{0.05}$N film was improved conspicuously. Moreover, compared Example 1 with Example 2, by developing the crystallinity of the AlN film as an underfilm for the Al$_{0.95}$Ga$_{0.05}$N film, the dislocation density of the Al$_{0.95}$Ga$_{0.05}$N film can be greatly reduced.

As a result, if a semiconductor light-emitting element is constructed of the Al$_{0.95}$Ga$_{0.05}$N film, the luminance efficiency thereof can be enhanced. Similarly, if a semiconductor element such as a high velocity IC chip was constructed of the Al$_{0.95}$Ga$_{0.05}$N film, the response performance thereof can be enhanced.

Although the present invention was described in detail with reference to the above examples, this invention is not limited to the above disclosure and every kind of variation and modification may be made without departing from the scope of the present invention.

For example, in the above Examples, although the island-shaped crystal portions and the Al$_{0.95}$Ga$_{0.05}$N film were made in the same MOCVD apparatus, they may be made in their respective different apparatuses. Moreover, in the above embodiments, although the island-shaped crystal portions were formed directly on the base, they may be formed via a given buffer layer or a distorted superlattice structure. The buffer layer and the distorted superlattice structure may be made by controlling base temperature, flow rate of raw material gas, ambient pressure, amount of raw material gas or sort and amount of additive gas at MOCVD.

As mentioned above, according to the present invention, a nitride film of low dislocation density and thus, high crystal quality can be easily obtained by a conventional film growth method like MOCVD, MBE and so on. Therefore, if a semiconductor element is constructed of the nitride film, the total crystal quality of the semiconductor element can be improved, and thus, the performance of the semiconductor element can be developed.

What is claimed is:

1. A method for fabricating a III nitride film, comprising the steps of:
    preparing a given base comprising a first Al-including nitride;
    forming plural island-shaped crystal portions comprising a second nitride, and being isolated from one another; and
    epitaxially growing a nitride film comprising a third nitride from said island-shaped crystal portions functioning as nuclei.

2. A fabricating method as defined in claim 1, wherein the average area of the top surface of each of said island-shaped crystal portions is set within 0.0001–1000 μm$^2$.

3. A fabricating method as defined in claim 1, wherein the Al content of said second nitride is set smaller than the Al content of said first Al-including nitride.

4. A fabricating method as defined in claim 3, wherein said second nitride has a composition of Al$_{x1}$Ga$_{x2}$In$_{x3}$N (x1+x2+x3=1, x1, x2, x3≧0) and said first Al-including nitride has a composition of Al$_{y1}$Ga$_{y2}$In$_{y3}$N (y1+y2+y3=1, y1>0, y2, y3≧0), and the relation of x1≦y1−0.1 is satisfied for the Al content x1 of said second nitride and the Al content y1 of said first nitride.

5. A fabricating method as defined in claim 4, wherein the dislocation density of said nitride film comprising said third nitride is 10$^{10}$/cm$^2$ or below.

6. A fabricating method as defined in claim 4, wherein the relation of x1≦y1−0.5 is satisfied for the Al content x1 of said second nitride and the Al content y1 of said first nitride.

7. A fabricating method as defined in claim 6, wherein the dislocation density of said nitride film comprising said third nitride is 10$^9$/cm$^2$ or below.

8. A fabricating method as defined in claim 1, wherein a full width of half maximum (FWHM) X-ray rocking curve value at (002) reflection of said first Al-including nitride is 90 seconds or below.

9. A fabricating method as defined in claim 1, wherein said base is self-supporting.

10. A semiconductor element comprising a nitride film fabricated by a method as defined in claim 1.

11. A substrate for epitaxial growth, comprising:
    a base comprising a first Al-including nitride; and
    plural island-shaped crystal portions comprising a second nitride formed on said base and isolated from one another, wherein
    the Al content of said second nitride is set smaller than the Al content of said first Al-including nitride.

12. A substrate as defined in claim 11, wherein the average area of the top surface of each of said island-shaped crystal portions is set within 0.0001–1000 μm$^2$.

13. A substrate as defined in claim 11, wherein said second nitride has a composition of Al$_{x1}$Ga$_{x2}$In$_{x3}$N (x1+x2+x3=1, x1, x2, x3≧0) and said first Al-including nitride has a composition of Al$_{y1}$Ga$_{y2}$In$_{y3}$N (y1+y2+y3=1, y1>0, y2, y3≧0), and the relation of x1≦y1−0.1 is satisfied for the Al content x1 of said second nitride and the Al content y1 of said first nitride.

14. A substrate as defined in claim 11, wherein a full width of half maximum (FWHM) X-ray rocking curve value at (002) reflection of said first Al-including nitride is 90 seconds or below.

15. A substrate as defined in claim 11, wherein said second nitride defines a non-light emitting layer.

16. A substrate as defined in claim 11, wherein said base is self-supporting.

17. A semiconductor element comprising a substrate for epitaxial growth as defined in claim 11.

* * * * *